(12) United States Patent
Takyu et al.

(10) Patent No.: US 9,893,116 B2
(45) Date of Patent: Feb. 13, 2018

(54) MANUFACTURING METHOD OF ELECTRONIC DEVICE AND MANUFACTURING METHOD OF SEMICONDUCTOR DEVICE

(71) Applicant: TOSHIBA MEMORY CORPORATION, Minato-ku (JP)

(72) Inventors: Shinya Takyu, Shiraoka (JP); Hideo Numata, Ota (JP); Hiroyuki Okura, Nerima (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 84 days.

(21) Appl. No.: 14/657,272

(22) Filed: Mar. 13, 2015

(65) Prior Publication Data

US 2016/0079303 A1 Mar. 17, 2016

(30) Foreign Application Priority Data

Sep. 16, 2014 (JP) ................................ 2014-188282

(51) Int. Cl.
*H01L 27/146* (2006.01)
*H01L 21/306* (2006.01)
*H01L 21/304* (2006.01)

(52) U.S. Cl.
CPC .... *H01L 27/14687* (2013.01); *H01L 27/1464* (2013.01); *H01L 27/1469* (2013.01); *H01L 27/14634* (2013.01); *H01L 21/3043* (2013.01); *H01L 21/30625* (2013.01)

(58) Field of Classification Search
CPC .................................................. H01L 27/14687
See application file for complete search history.

(56) References Cited

U.S. PATENT DOCUMENTS

| 8,778,778 | B2 | 7/2014 | Tanida et al. | |
|---|---|---|---|---|
| 2005/0112893 | A1* | 5/2005 | Koyata | B24B 37/042 438/692 |
| 2006/0076887 | A1* | 4/2006 | Kang | H01L 27/3246 313/512 |
| 2011/0317050 | A1 | 12/2011 | Shirono et al. | |
| 2012/0211849 | A1 | 8/2012 | Matsugai | |

FOREIGN PATENT DOCUMENTS

| JP | 2012-9725 | 1/2012 |
|---|---|---|
| JP | 2012-49249 | 3/2012 |
| JP | 2012-174937 | 9/2012 |
| JP | 2012-204545 | 10/2012 |

* cited by examiner

*Primary Examiner* — Alexander Ghyka
(74) *Attorney, Agent, or Firm* — Oblon, McClelland, Maier & Neustadt, L.L.P.

(57) ABSTRACT

A manufacturing method of an electronic device processes a surface of a first wafer, bonds a surface of a second wafer to the processed surface of the first wafer, thins the first wafer by polishing a back surface of the first wafer, the back surface being located on an opposite side of the processed surface, forms a groove along a periphery of the back surface of the thinned first wafer by using a dicing blade, attaches a protective layer to the back surface of the first wafer having the groove, via a bonding layer, and polishes a back surface of the second wafer, the back surface being located on an opposite side of the surface attached to the protective layer.

15 Claims, 5 Drawing Sheets

MANUFACTURING METHOD OF ELECTRONIC DEVICE AND MANUFACTURING METHOD OF SEMICONDUCTOR DEVICE

CROSS REFERENCE TO RELATED APPLICATIONS

This application is based upon and claims the benefit of priority from the prior Japanese Patent Application No. 2014-188282, filed on Sep. 16, 2014, the entire contents of which are incorporated herein by reference.

FIELD

Embodiments of the present invention relate to a manufacturing method of an electronic device and a manufacturing method of a semiconductor device.

BACKGROUND

A back-illuminated image sensor having the light receiving face of a photodiode on the back surface of a semiconductor substrate has attracted attention in the field of solid-state imaging devices such as a CMOS (Complementary Metal Oxide Silicon) sensor and a CCD (Charged Coupled Device). The back-illuminated image sensor, which does not require to form wiring and an extra film on the light receiving face, can obtain a sensitivity higher than that of a front-illuminated image sensor.

When manufacturing the back-illuminated image sensor, a first wafer having photodiodes etc. formed thereon is bonded to a second wafer, and then the back surface of the first wafer is polished to be thinned. After that, the back surface of the second wafer is also polished to be thinned. At the point when starting polishing the second wafer, the first wafer has already been thinned, and the surface on its periphery has gotten rough due to the polishing. This rough surface causes the film having photodiodes etc. to come unstuck, and a polishing dust lowers film quality.

Accordingly, it is considered to form a smooth recess along the periphery of the first wafer before polishing the second wafer.

When polishing the second wafer, a protective tape is attached to the surface of the first wafer having the recess formed thereon, and then the back surface of the second wafer is polished. Since the bonding film of the protective tape does not come into contact with the whole surface of the recess, the polishing dust enters the gap between the bonding film and the surface of the recess, which leads to an increased incidence of deficiencies such as separation of the bonding film and reduction in film quality. Further, the recess having a wide width reduces the area to form elements on the wafer, which deteriorates productive efficiency. Further, when the recess has an excessively deep depth, the periphery of the wafer may possibly chip.

DETAILED DESCRIPTION

Figure 1A:
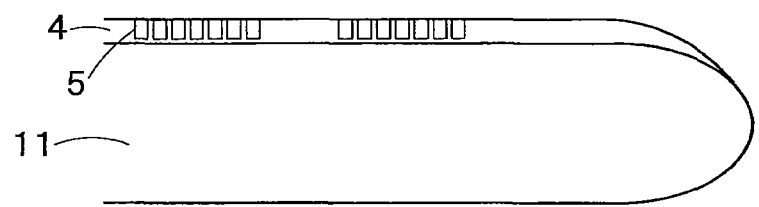
FIGS. 1A, 1B, 1C, and 1D are manufacturing process diagrams of a back-illuminated image sensor 1 according to an embodiment.

A manufacturing method of an electronic device according to one embodiment processes a surface of a first wafer, bonds a surface of a second wafer to the processed surface of the first wafer, thins the first wafer by polishing a back surface of the first wafer, the back surface being located on an opposite side of the processed surface, forms a groove along a periphery of the back surface of the thinned first wafer by using a dicing blade, attaches a protective layer to the back surface of the first wafer having the groove, via a bonding layer, and polishes a back surface of the second wafer, the back surface being located on an opposite side of the surface attached to the protective layer.

Hereinafter, embodiments of the present invention will be explained referring to the drawings. The upper/lower direction in the following embodiments shows a relative direction when the face on which electronic devices are provided is defined as the upper side, and thus may be different from the actual upper/lower direction depending on gravitational acceleration.

First Embodiment

The present embodiment can be applied to electronic devices such as semiconductor devices and MEMS (Micro Electro Mechanical Systems) which can be formed on a wafer bonded to another wafer. As a concrete example of such electronic devices, there is a solid-state imaging device such as a CMOS sensor and a CCD. More concretely, the manufacturing method according to the present embodiment can be applied to a manufacturing method of a back-illuminated image sensor, for example.

FIGS. 1 to 3 are manufacturing process diagrams of a back-illuminated image sensor 1 according to the present embodiment. The back-illuminated image sensor 1 produced through the manufacturing process of FIG. 1 has a cross section structure as shown in FIG. 4 for example. FIG. 4 shows a cross section structure corresponding to one pixel, which is composed of three sub-pixels of RGB. Each sub-pixel has a microlens 2, a color filter 3, and a sensor part 4. The microlens 2 is provided on the back side, and a multi-layer wiring part 6 is provided on the front side. Light incident on the microlens 2 enters a photodiode 5 in the sensor part 4 without passing through the multi-layer wiring part 6, which makes it possible to increase the efficiency of light utilization, and improve sensitivity.

Next, based on FIGS. 1 to 3, a manufacturing process of the back-illuminated image sensor 1 according to the first embodiment will be explained step by step. First, as shown in FIG. 1A, the sensor part 4 including the photodiodes 5 and transistors are formed on a first wafer 11. Each transistor performs control for reading an electrical signal obtained through photoelectric conversion by using the photodiode 5.

Figure 1B:
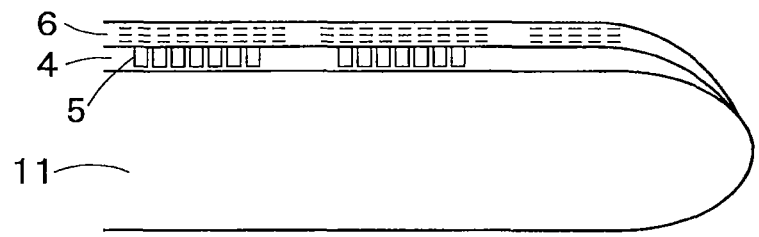

Next, as shown in FIG. 1B, the multi-layer wiring part 6 is formed on the sensor part 4. As shown in FIG. 4, the multi-layer wiring part 6 has multi-layer wiring layers 7 arranged in the stacking direction of the layers, and insulating layers 8 each arranged between the wiring layers.

Figure 1C:
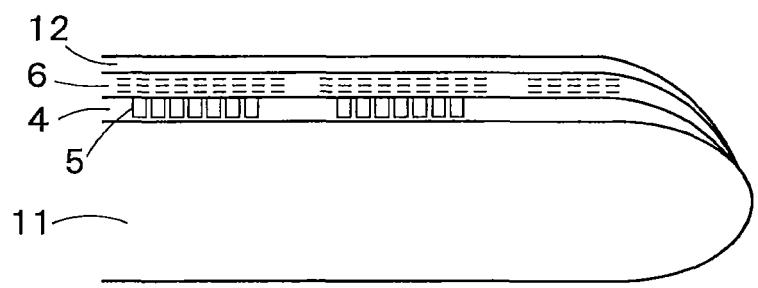

Next, as shown in FIG. 1C, a bonding layer 12 is formed on the multi-layer wiring part 6. Instead of using the bonding layer 12, a bonding material may be applied to the multi-layer wiring part 6. It is desirable that the surface of the bonding layer 12 is flat as much as possible since the bonding layer 12 has a function of bonding the first wafer 11 to a second wafer 13 as mentioned later. Thus, after forming the bonding layer 12, the bonding layer 12 may be planarized through mechanical polishing, chemical mechanical polishing, etc.

Figure 1D:
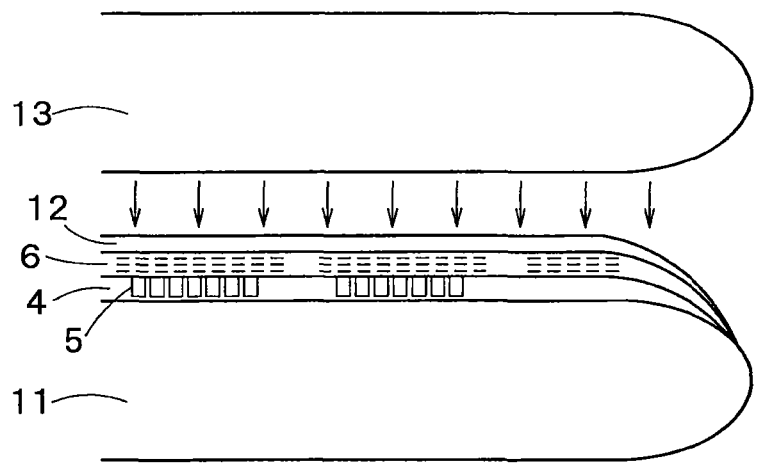

Next, as shown in FIG. 1D, the second wafer 13 is bonded to the first wafer 11 through the bonding layer 12. The second wafer 13, which has the approximately same size as the first wafer 11, is a supporting substrate for supporting the first wafer 11. The bonding layer 12 on the first wafer 11 may be bonded directly to the second wafer 13, or may be bonded to the second wafer 13 through, e.g., a metal film formed on the bonding layer 12. When bonding the bonding layer 12 on the first wafer 11 directly to the second wafer 13, it is desirable to previously clean the surface of the bonding layer 12 and the surface of the second wafer 13 to remove the contaminant thereon. This is because the contaminant between the bonding layer 12 and the second wafer 13 reduces bonding strength and allows the second wafer 13 to come unstuck easily. The second wafer 13 is bonded for the following reasons. The first wafer 11 should be thinned as much as possible in order to increase the sensitivity of the photodiode 5 on the first wafer 11, but the strength of the thinned first wafer 11 by itself is unstable. Thus, the second wafer 13 is previously attached to the first wafer 11 as a supporting substrate of the first wafer 11 to be thinned.

Figure 2A:
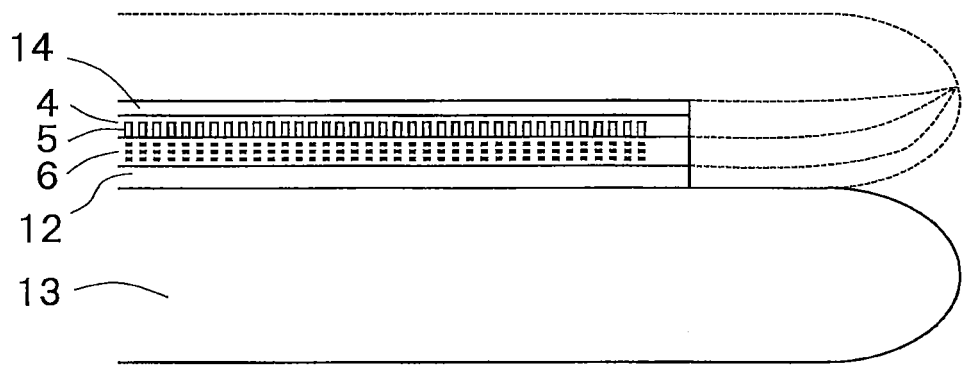
FIGS. 2A and 2B are manufacturing process diagrams following FIG. 1.

Next, as shown in FIG. 2A, the back surface of the first wafer 11, which is i.e. a face on the opposite side of the bonding layer 12, is polished through mechanical polishing, chemical mechanical polishing, etc., to thin the first wafer 11. Accordingly, with respect to the back side of the first wafer 11, a thin residual film 14 adheres to the top surface of the sensor part 4. When the first wafer 11 is a silicon substrate, the residual film 14 has a thickness of about 0.1 μm to 0.2 μm. Further, when the first wafer 11 is an SOI (Silicon On Insulator) substrate, the residual film 14 may be any one of an embedded oxide film and a silicon film.

Figure 2B:
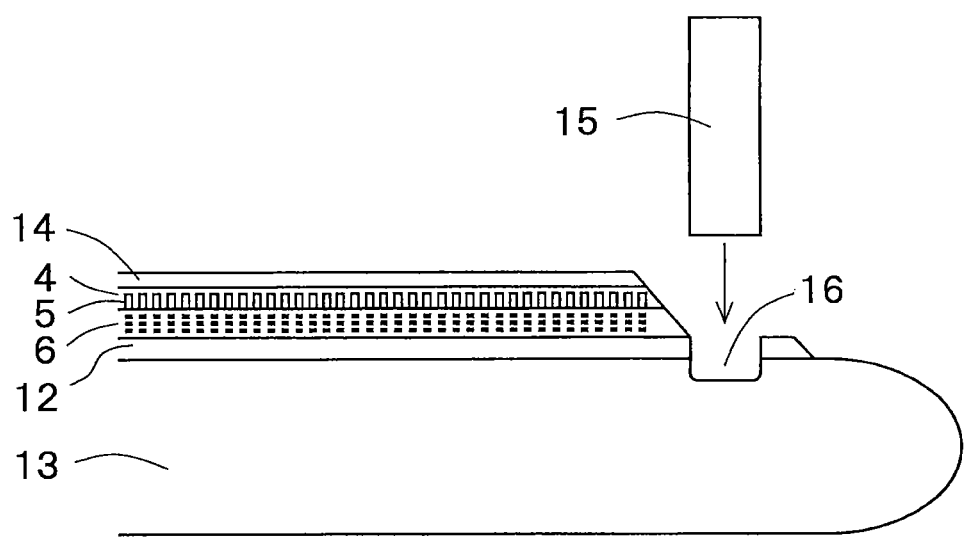

Due to the polishing, the periphery of the back surface of the first wafer 11 gets rough, and a polishing dust is generated from the end faces of the sensor part 4 and multi-layer wiring part 6. Further, a gap generated between the end faces allows the first wafer 11 to come unstuck easily. Thus, as shown in FIG. 2B, a dicing blade 15 for dicing wafers is generally used to form a groove 16 having a predetermined width and a predetermined depth along the periphery of the back side of the first wafer 11.

It is desirable that the groove 16 is formed deeper than the bottom surface of the undermost multi-layer wiring layer 7 for the following reasons. When the depth of the groove 16 is lower than the bottom surface of the undermost multi-layer wiring layer 7, the multi-layer wiring layers 7 remain under the groove 16, which leads to a possibility that a metal dust generated from the edges of the remaining multi-layer wiring layers 7 accumulates in the groove 16, and the edges of the multi-layer wiring layers 7 come unstuck due to a gap generated therebetween.

Further, it is desirable that the depth of the groove 16 is equal to or smaller than the thickness obtained by subtracting 20 μm from a combined thickness of the first wafer 11 and second wafer 13 after polishing the back surface of the second wafer 13 in a process to be performed later. If the groove 16 is deeper than this thickness, the groove 16 is too deep, which decreases strength and the first wafer 11 and second wafer 13 may possibly fracture from the groove 16.

Further, it is desirable that the groove 16 has a width of about 0.1 to 1.0 mm. The width at this level allows to form the groove 16 without narrowing the area of chips to be formed on the first wafer 11.

Figure 3A:
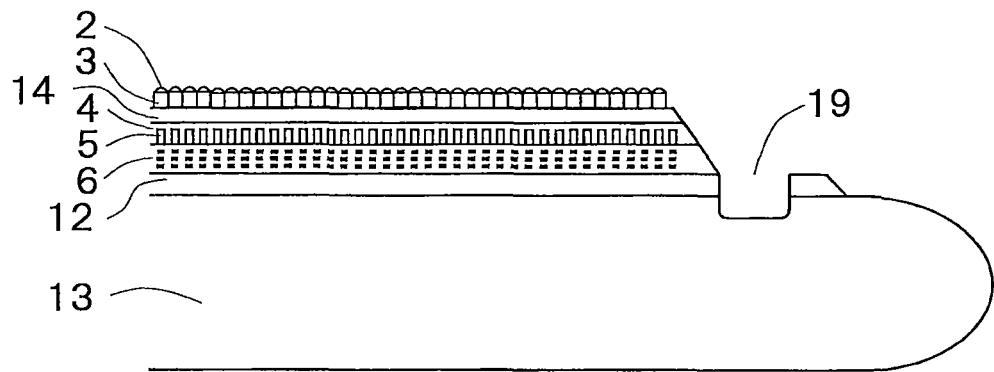
FIGS. 3A, 3B, and 3C are manufacturing process diagrams following FIG. 2.
Figure 4:
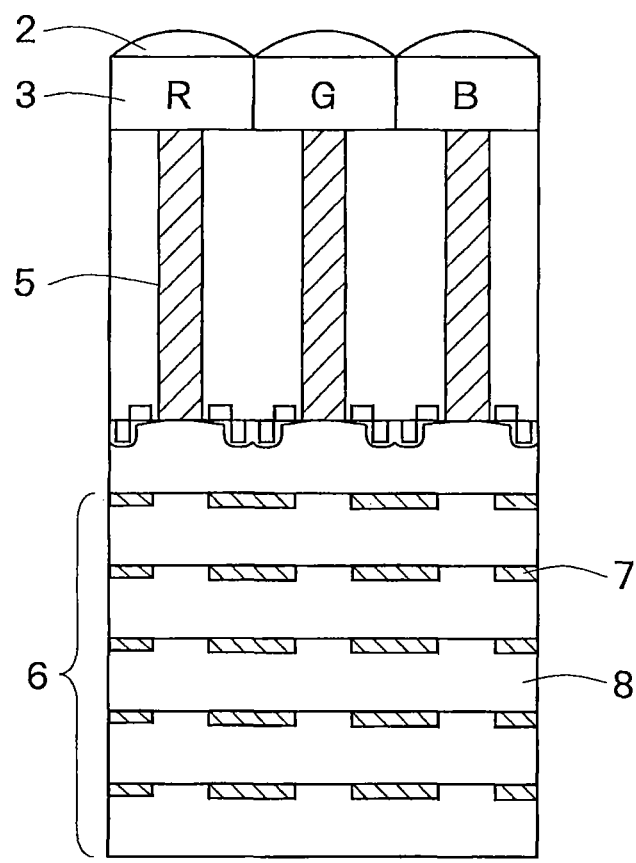
FIG. 4 is a sectional view showing a cross section structure corresponding to one pixel.

After that, as shown in FIG. 3A, the color filter 3 is formed on the surface of the sensor part 4, and the microlens 2 is formed further thereon.

Figure 3B:
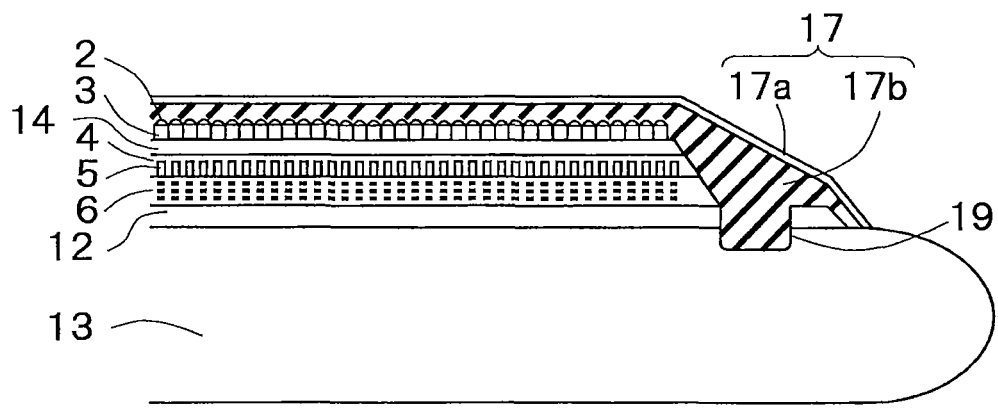

Next, as shown in FIG. 3B, the surface of the first wafer 11 having the groove 16 is protected by a protective tape 17. The protective tape 17 has a multi layers structure obtained by attaching a bonding layer 17b to a base material layer (protective layer) 17a. This bonding layer 17b is bonded to the surface of the first wafer 11. The bonding layer 17b of the protective tape 17 is made of a flexible material, and enters the groove 16. In particular, when the surface of the groove 16 having the depth and width within the above range is covered by the protective tape 17, the bonding layer 17b of the protective tape 17 enters the groove 16 to almost eliminate the gap within the groove 16. Thus, less polishing dust enters the groove 16, which makes it possible to prevent the end faces of the sensor part 4 and multi-layer wiring part 6 from being polluted.

Figure 3C:
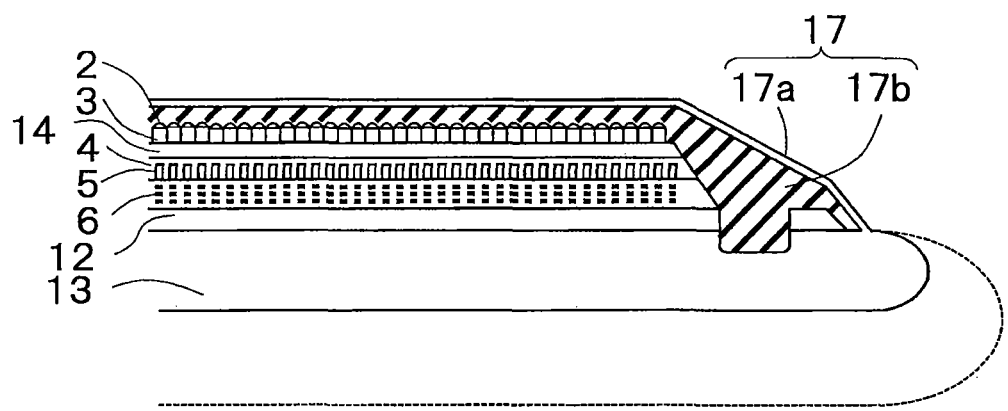

Next, as shown in FIG. 3C, while protecting the surface of the first wafer 11 by the protective tape 17, the back surface of the second wafer 13 on the opposite side is polished and thinned through mechanical polishing, chemical mechanical polishing, etc. In this way, the back-illuminated image sensor 1 having a cross section structure as shown in FIG. 4 can be obtained.

Figure 5:
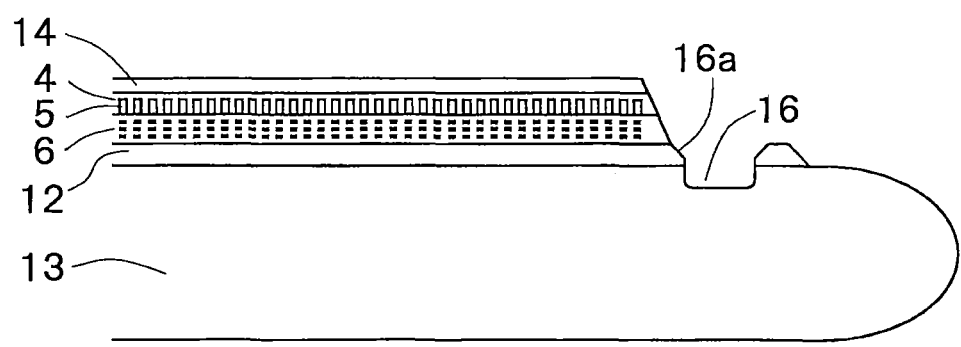
FIG. 5 is a sectional view showing a groove formed by a dicing blade.

In the example explained in FIG. 2, the groove 16 to be formed has a predetermined depth. However, as shown in FIG. 5, the width near the top of the groove 16 may be set larger than the width inside the groove 16. Since the blade of the dicing blade 15 can be generally exchanged, it is possible that a V-shaped blade is utilized first to form an initial groove 16a having a shallow depth and a wide width near the top of the groove 16, and then the V-shaped blade is exchanged to a blade having a narrow width to form the groove 16 having a uniform depth at the center of the initial groove 16a. Note that when the width of the initial groove 16a is made too wide, the area of chips to be formed on the first wafer 11 becomes narrow. Thus, it is desirable that the width of the initial groove 16a should be set not to influence the area of chips to be formed.

Figure 6A:
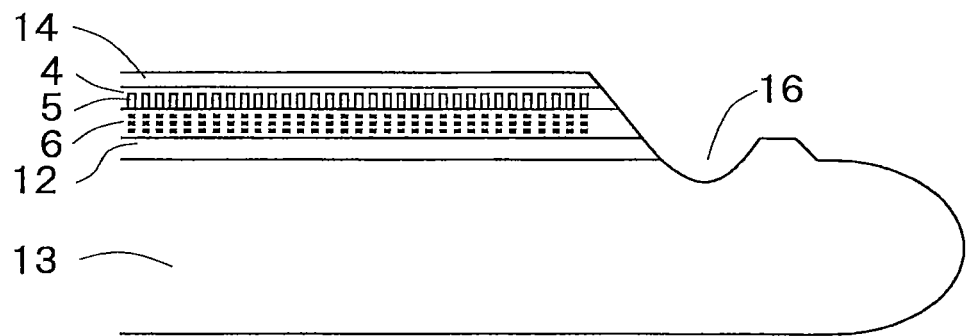
FIG. 6A and FIG. 6B are sectional views each showing a cross-sectional shape of a groove 16 according to a comparative example.
Figure 6B:
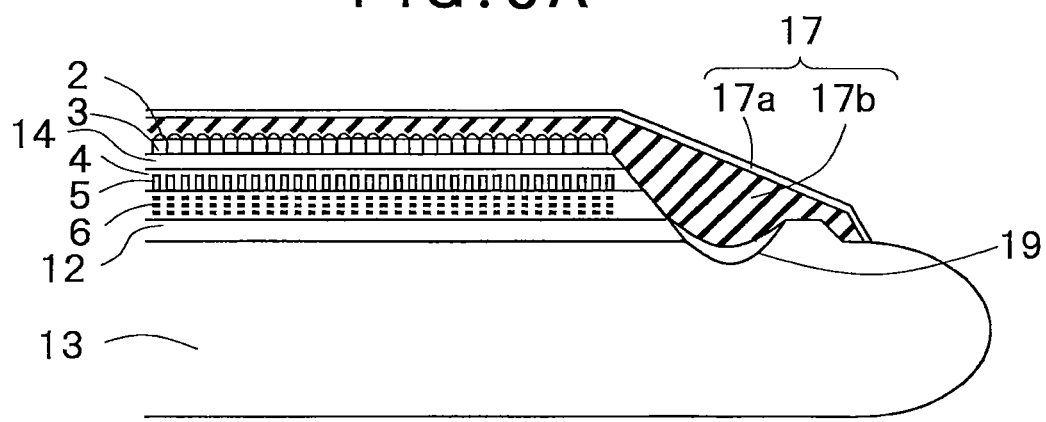

FIG. 6A is a sectional view showing a cross-sectional shape of the groove 16 according to a comparative example. The groove 16 of FIG. 6A is formed so that the end faces of the sensor part 4 and multi-layer wiring part 6 become slant. Since the groove 16 of FIG. 6A has a slant face, the width of the groove 16 becomes larger compared to the present embodiment, which means that the area of chips to be formed on the first wafer 11 becomes narrow and the number of chips obtained from one wafer reduces. Further, in the case of the groove 16 of FIG. 6A, the width of the groove 16 is wide and the depth of the groove 16 is deep, which means that when covering the face of the groove 16 with the protective tape 17, a gap 19b may possibly be generated in a part of the groove 16 failing to cover the whole of the groove 16 by the bonding layer 17b of the protective tape 17, as shown in FIG. 6B. Thus, a polishing dust generated when polishing the second wafer 13 in a process to be performed later may possibly enter the groove 16.

As stated above, in the first embodiment, after the back surface of the first wafer 11 bonded to the second wafer 13 is polished and thinned, the groove 16 having a predetermined width and a uniform depth is formed along the periphery of the polished face by using the dicing blade 15, which makes it possible to make the bonding layer of the protective tape 17 enter the groove 16 when attaching the protective tape 17 to the polished face later, thereby preventing a gap in the groove 16. This makes it possible to prevent a polishing dust from entering the groove 16 when polishing the back surface of the second wafer 13 later. Further, since the groove 16 has a width of about 0.1 to 1.0 mm, the groove 16 has almost no influence on the area of chips to be formed on the first wafer 11, which means that the number of chips obtained from one wafer is not reduced. Furthermore, since the depth of the groove 16 is equal to or smaller than the thickness obtained by subtracting 20 µm from a combined thickness of the first wafer 11 and second wafer 13 after polishing the back surface of the second wafer 13, the strength of two wafers bonded to each other is not decreased even when the groove 16 is provided, which makes it possible to prevent these wafers from fracturing from the groove 16.

Second Embodiment

In the above first embodiment, the groove 16 is formed to be close to the outer circumference of a wafer as much as possible. A second embodiment to be explained below is characterized in forming the groove 16 on the inner side compared to the first embodiment.

Figure 7:
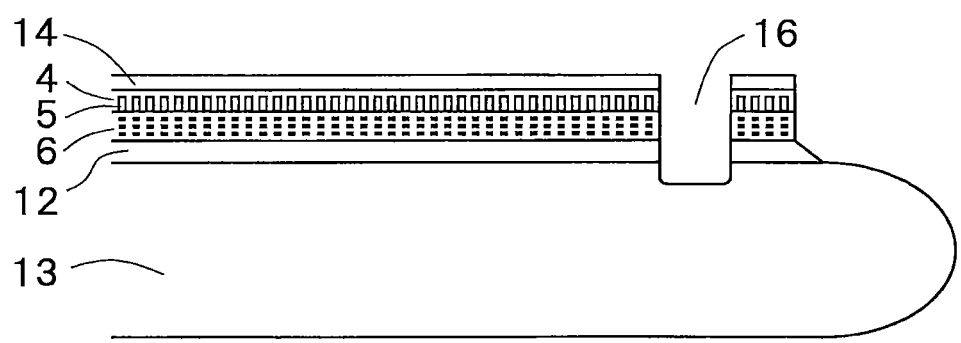
FIG. 7 is a sectional view showing a place to form the groove 16 according to a second embodiment.

FIG. 7 is a sectional view showing a place to form the groove 16 according to the second embodiment. The groove 16 shown in FIG. 7 is formed in an inner radial direction compared to the groove 16 in the first embodiment, and the sensor part 4 and multi-layer wiring part 6 remain in the outer radial direction from the groove 16. In the first embodiment, the groove 16 is formed so that the height of the first wafer 11 in the outer radial direction from the groove 16 becomes lower than the height of the first wafer 11 in the inner radial direction from the groove 16. On the other hand, in the second embodiment, the groove 16 is formed so that the height of the first wafer 11 in the outer radial direction from the groove 16 becomes the same as the height of the first wafer 11 in the inner radial direction from the groove 16.

Similarly to the first embodiment, the groove 16 of FIG. 7 is formed using the dicing blade 15. The groove 16 is formed by positioning the dicing blade 15 so that the groove 16 is formed in a slightly inner part in the radial direction compared to the first embodiment. The width and depth of the groove 16 are set similarly to the first embodiment. The width of the groove 16 may be narrowed to some extent since the groove 16 is formed in the inner radial direction, in order not to reduce the area of chips to be formed on the first wafer 11.

In the present embodiment, the groove 16 is formed so that the sensor part 4 and multi-layer wiring part 6 remain in the outer radial direction from the groove 16 for the following reasons.

There is a case where the management number of the wafer is shown on the periphery of the wafer. In such a case, if the groove 16 is formed near the periphery, the management number is removed, which may possibly affect the management of the lot of the wafer. Thus, in the present embodiment, the groove 16 is formed in the inner radial direction from the groove 16 to be apart from the management number, which makes it possible to manage the lot of the wafer even after forming the groove 16.

Further, the wiring part etc. remaining on the outer circumference side of the groove 16 make it possible to prevent a polishing dust from entering the groove 16 from the end face of the wafer.

As stated above, in the second embodiment, since the groove 16 is formed by the dicing blade 15 in a slightly inner part in the radial direction compared to the first embodiment, the sensor part 4 and multi-layer wiring part 6 can be left in the outer radial direction from the groove 16, which makes it possible to prevent the groove 16 from removing the management number for managing the lot of the wafer, and to prevent a polishing dust etc. generated from the end face of the wafer from entering the groove 16.

In the examples explained in the above first and second embodiments, the back-illuminated image sensor 1 is formed on the first wafer 11. However, the device to be formed on the first wafer 11 should not be limited to the image sensor 1. It may be replaced by an arbitrary semiconductor device or a MEMS. Further, a plurality of types of semiconductor devices, or a mixture of semiconductor devices and MEMS may be formed on the first wafer 11.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A manufacturing method of an electronic device, comprising:
    processing a surface of a first wafer;
    forming a wiring layer on the surface of the first wafer via a first bonding layer;
    bonding a surface of a second wafer to the processed surface of the first wafer;
    thinning the first wafer by polishing a back surface of the first wafer, the back surface being located on an opposite side of the processed surface;
    forming a groove along a periphery of the back surface of the thinned first wafer by using a dicing blade, so that at least a part of the first bonding layer remains on an outer circumference side of the groove, the groove having a bottom surface, a first side surface and a second side surface, the bottom surface being between the first side surface and the second side surface;
    attaching a protective layer to the back surface of the first wafer having the groove, via a second bonding layer; and
    polishing a back surface of the second wafer, the back surface being located on an opposite side of the surface attached to the protective layer.

2. The manufacturing method of claim 1,
    wherein
    the groove is formed deeper than a bottom surface of the wiring layer.

3. The manufacturing method of claim 1,
    wherein the depth of the groove is equal to or smaller than a thickness obtained by subtracting 20 µm from a combined thickness of the first wafer and the second wafer after polishing the back surface of the second wafer.

4. The manufacturing method of claim 1, wherein the groove has a width of 0.1 to 1.0 mm.

5. The manufacturing method of claim 1, wherein when forming the groove, a tapered initial groove is formed first, and then the groove having a predetermined width and a predetermined depth is formed nearly at the center of the initial groove.

6. The manufacturing method of claim 1, wherein when forming the groove, the groove is formed so that the height of the first wafer in an outer radial direction from the groove is lower than the height of the first wafer in an inner radial direction from the groove.

7. The manufacturing method of claim 1, wherein when forming the groove, the groove is formed so that the height of the first wafer in an outer radial direction from the groove is identical to the height of the first wafer in an inner radial direction from the groove.

8. The manufacturing method of claim 1, wherein the processing of the surface of the first wafer is performed to form: a photoelectric conversion element; a transfer circuit to transfer an electrical signal obtained through photoelectric conversion by using the photoelectric conversion element; an A/D converter to convert the transferred electrical signal into a digital signal; and an output circuit to output the digital signal.

9. A manufacturing method of a semiconductor device, comprising:
processing a surface of a first wafer to form a photoelectric conversion element, a transfer circuit to transfer an electrical signal obtained through photoelectric conversion by using the photoelectric conversion element, an A/D converter to convert the transferred electrical signal into a digital signal, and an output circuit to output the digital signal on the first wafer;
forming a wiring layer on the surface of the first wafer via a first bonding layer;
bonding a surface of a second wafer to the processed surface of the first wafer;
thinning the first wafer by polishing a back surface of the first wafer, the back surface being located on an opposite side of the processed surface;
forming a groove along a periphery of the back surface of the thinned first wafer by using a dicing blade, so that at least a part of the first bonding layer remains on an outer circumference side of the groove, the groove having a bottom surface, a first side surface and a second side surface, the bottom surface being between the first side surface and the second side surface;
attaching a protective layer to the back surface of the first wafer having the groove, via a second bonding layer; and
polishing a back surface of the second wafer, the back surface being located on an opposite side of the surface attached to the protective layer.

10. The manufacturing method of claim 9, wherein
the groove is formed deeper than a bottom surface of the wiring layer.

11. The manufacturing method of claim 9, wherein the depth of the groove is equal to or smaller than a thickness obtained by subtracting 20 µm from a combined thickness of the first wafer and the second wafer after polishing the back surface of the second wafer.

12. The manufacturing method of claim 9, wherein the groove has a width of 0.1 to 1.0 mm.

13. The manufacturing method of claim 9, wherein when forming the groove, a tapered initial groove is formed first, and then the groove having a predetermined width and a predetermined depth is formed nearly at the center of the initial groove.

14. The manufacturing method of claim 9, wherein when forming the groove, the groove is formed so that the height of the first wafer in an outer radial direction from the groove is lower than the height of the first wafer in an inner radial direction from the groove.

15. The manufacturing method of claim 9, wherein when forming the groove, the groove is formed so that the height of the first wafer in an outer radial direction from the groove is identical to the height of the first wafer in an inner radial direction from the groove.

* * * * *